United States Patent
Nguyen et al.

(10) Patent No.: US 7,608,324 B2
(45) Date of Patent: Oct. 27, 2009

(54) INTERFACE MATERIALS AND METHODS OF PRODUCTION AND USE THEREOF

(75) Inventors: My N. Nguyen, Poway, CA (US); Nancy Dean, Libert Lake, WA (US); Kenishiro Fukuyama, Spokane, WA (US)

(73) Assignee: Honeywell International Inc., Morristown, NJ (US)

( * ) Notice: Subject to any disclaimer, the term of this patent is extended or adjusted under 35 U.S.C. 154(b) by 753 days.

(21) Appl. No.: 10/465,968

(22) PCT Filed: May 30, 2002

(86) PCT No.: PCT/US02/17331

§ 371 (c)(1), (2), (4) Date: Sep. 2, 2004

(87) PCT Pub. No.: WO02/096636

PCT Pub. Date: Dec. 5, 2002

(65) Prior Publication Data

US 2007/0098971 A1    May 3, 2007

(51) Int. Cl.
*B32B 5/16*    (2006.01)
(52) U.S. Cl. .................. 428/323; 428/411.1; 428/326; 156/157; 252/511; 252/502; 361/704
(58) Field of Classification Search ............. 428/323, 428/411.1, 326; 156/157; 252/511, 502; 361/704
See application file for complete search history.

(56) References Cited

U.S. PATENT DOCUMENTS 5,489,637 A    2/1996 Nguyen et al.
5,725,707 A *  3/1998 Koon et al. ............... 156/157
5,852,548 A * 12/1998 Koon et al. ............... 361/704
6,605,238 B2 * 8/2003 Nguyen et al. ........... 252/502
6,673,434 B2 * 1/2004 Nguyen ..................... 428/323
6,706,219 B2 * 3/2004 Nguyen ..................... 252/511
6,797,382 B2 * 9/2004 Nguyen et al. .......... 428/411.1
6,811,725 B2 * 11/2004 Nguyen et al. ........... 252/511
6,908,669 B2 * 6/2005 Nguyen ..................... 428/323
7,172,711 B2 * 2/2007 Nguyen ..................... 252/511

FOREIGN PATENT DOCUMENTS

| EP | 1039537 A | 9/2000 |
|---|---|---|
| EP | 1039537 A2 | 9/2000 |
| EP | 02729331.5 | 3/2004 |
| JP | 53077297 | 7/1978 |
| JP | 61004255 | 1/1986 |
| JP | 10330575 | 12/1998 |
| JP | 2000174070 | 6/2000 |
| JP | 2000174070 | 1/2001 |
| WO | 99/67811 A2 | 12/1999 |
| WO | WO99/67811 * | 12/1999 |
| WO | 00/33628 A1 | 6/2000 |
| WO | 01/20618 A1 | 3/2001 |

* cited by examiner

*Primary Examiner*—Leszek Kiliman
(74) *Attorney, Agent, or Firm*—Sandra P. Thompson; Buchalter Nemer

(57) ABSTRACT

Layered interface materials described herein comprise at least one crosslinkable thermal interface component and at least one compliant fibrous interface component coupled to the thermal interface component. A method of forming layered interface materials comprises: a) providing a crosslinkable thermal interface component; b) providing a compliant fibrous interface component; and c) physically coupling the thermal interface component and the compliant fibrous interface component. At least one additional layer, including a substrate layer, can be coupled to the layered interface material.

49 Claims, 4 Drawing Sheets

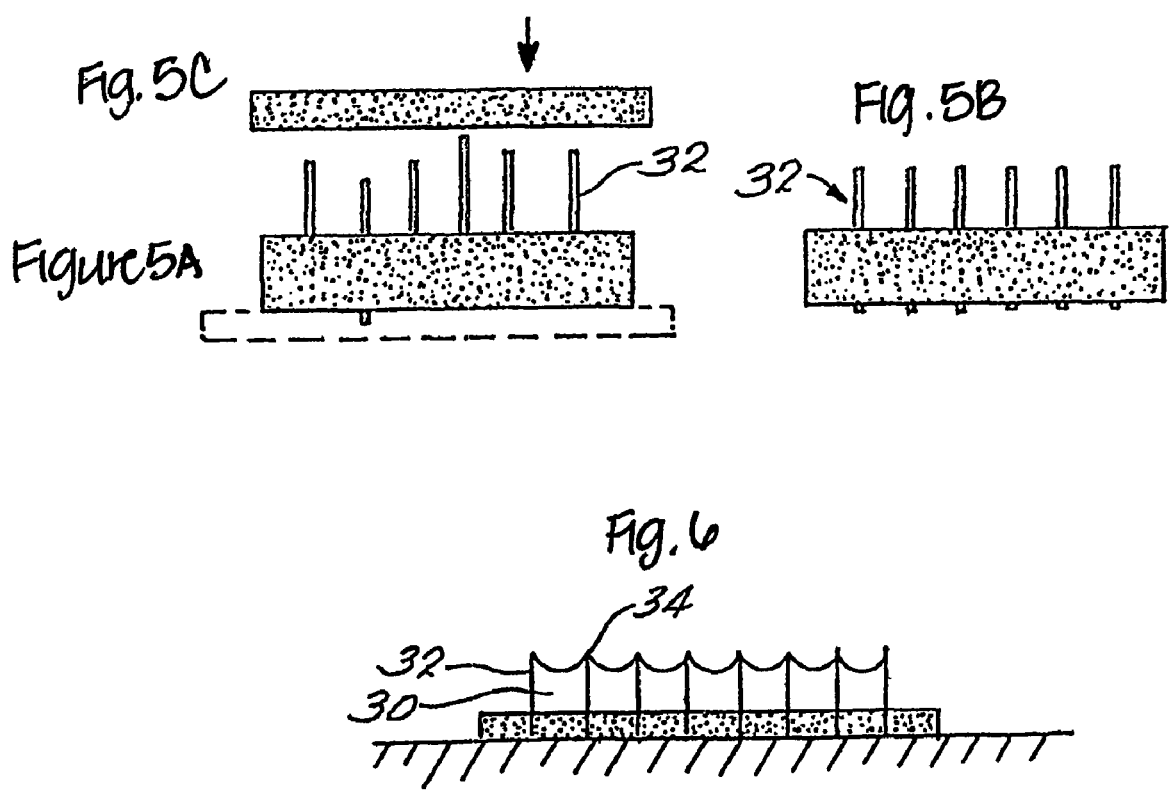

INTERFACE MATERIALS AND METHODS OF PRODUCTION AND USE THEREOF

FIELD OF THE INVENTION

The field of the invention is interface materials in electronic components, semiconductor components and other related layered materials applications.

BACKGROUND

Electronic components are used in ever increasing numbers of consumer and commercial electronic products. Examples of some of these consumer and commercial products are televisions, personal computers, internet servers, cell phones, pagers, palm-type organizers, portable radios, car stereos, or remote controls. As the demand for these consumer and commercial electronics increases, there is also a demand for those same products to become smaller, more functional, and more portable for consumers and businesses.

As a result of the size decrease in these products, the components that comprise the products must also become smaller. Examples of some of those components that need to be reduced in size or scaled down are printed circuit or wiring boards, resistors, wiring, keyboards, touch pads, and chip packaging.

Components, therefore, are being broken down and investigated to determine if there are better building materials and methods that will allow them to be scaled down to accommodate the demands for smaller electronic components. In layered components, one goal appears to be decreasing the number of the layers while at the same time increasing the functionality and durability of the remaining layers. This task can be difficult, however, given that several of the layers and components of the layers should generally be present in order to operate the device.

Also, as electronic devices become smaller and operate at higher speeds, energy emitted in the form of heat increases dramatically. A popular practice in the industry is to use thermal grease, or grease-like materials, alone or on a carrier in such devices to transfer the excess heat dissipated across physical interfaces. Most common types of thermal interface materials are thermal greases, phase change materials, and elastomer tapes. Thermal greases or phase change materials have lower thermal resistance than elastomer tape because of the ability to be spread in very thin layers and provide intimate contact between adjacent surfaces. Typical thermal impedance values range between 0.6-1.6° C. cm$^2$/w. However, a serious drawback of thermal grease is that thermal performance deteriorates significantly after thermal cycling, such as from 65° C. to 150° C., or after power cycling when used in VLSI chips. It has also been found that the performance of these materials deteriorates when large deviations from surface planarity causes gaps to form between the mating surfaces in the electronic devices or when large gaps between mating surfaces are present for other reasons, such as manufacturing tolerances, etc. When the heat transferability of these materials breaks down, the performance of the electronic device in which they are used is adversely affected.

Thus, there is a continuing need to: a) design and produce thermal interface materials and layered materials that meet customer specifications while minimizing the size of the device and number of layers; b) produce more efficient and better designed materials and/or components with respect to the compatibility requirements of the material, component or finished product; and c) develop reliable methods of producing desired thermal interface materials and layered materials and components comprising contemplated thermal interface and layered materials.

SUMMARY

Layered interface materials described herein comprise at least one crosslinkable thermal interface component and at least one compliant fibrous interface component coupled to the thermal interface component. A method of forming contemplated layered interface materials comprises: a) providing a crosslinkable thermal interface component; b) providing a compliant fibrous interface component; and c) physically coupling the thermal interface component and the compliant fibrous interface component. At least one additional layer, including a substrate layer, can be coupled to the layered interface material.

A constituent of layered interface materials described herein comprises at least one crosslinkable thermal interface component that is produced by combining at least one rubber compound, at least one amine resin and at least one thermally conductive filler. This contemplated thermal interface component takes on the form of a liquid or "soft gel". The gel state is brought about through a crosslinking reaction between the at least one rubber compound composition and the at least one amine resin composition. More specifically, the amine resin is incorporated into the rubber composition to crosslink the primary hydroxyl groups on the rubber compounds thus forming the soft gel phase. Therefore, it is contemplated that at least some of the rubber compounds will comprise at least one terminal hydroxyl group.

Amine or amine-based resins are added or incorporated into the rubber composition or mixture and/or combination of rubber compounds primarily to facilitate a crosslinking reaction between the amine resin and the primary or terminal hydroxyl groups on at least one of the rubber compounds. The crosslinking reaction between the amine resin and the rubber compounds leads to a "soft gel" phase to the mixture, instead of a liquid state.

Once the thermal interface component composition that comprises at least one rubber compound, at least one amine resin, and at least one thermally conductive filler has been prepared, the composition must be compared to the needs of the electronic component, vendor, or electronic product to determine whether a phase change material is needed to change some of the physical properties of the composition.

Phase change materials are useful in thermal interface component applications because they store and release heat as they oscillate between solid and liquid form. A phase change material gives off heat as it changes to a solid state, and as it returns to a liquid, it absorbs heat. The phase change temperature is the melting temperature at which the heat absorption and rejection takes place.

A method for forming the crosslinkable thermal interface components disclosed herein comprises a) providing at least one saturated rubber compound, b) providing at least one amine resin, c) crosslinking the at least one saturated rubber compound and the at least one amine resin to form a crosslinked rubber-resin mixture, d) adding at least one thermally conductive filler to the crosslinked rubber-resin mixture, and e) adding a wetting agent to the crosslinked rubber-resin mixture. This method can also further comprise adding at least one phase change material to the crosslinked rubber-resin mixture.

A contemplated thermal interface component can be provided as a dispensable liquid paste to be applied by dispensing methods and then cured as desired. It can also be provided as a highly compliant, cured, elastomer film or sheet for pre-application on interface surfaces or on other materials, such as heat sinks, substrates, and/or a compliant fibrous interface material or component. It can further be provided and produced as a soft gel or liquid that can be applied to surfaces by any suitable dispensing method. Even further, the material can be provided as a tape that can be applied directly to interface surfaces, substrates, compliant fibrous interface materials or component and/or electronic components.

Compliant fibrous interface components comprise a plurality of thermally conductive fibers, at least one encapsulant, and at least one optional adhesive material. Suitable thermally conductive fibers comprise diamond fibers, conductive polymer fibers, carbon fibers, graphite fibers and metal fibers, such as copper fibers and aluminum fibers. The thermally conductive fibers are cut to a particular length, usually depending on the needs/specifications of the customer or vendor, e.g. from at least about 0.0005 inches to at least about 1 inch. Thermally conductive fibers may also be cut to at least about 0.001 inches, to at least about 0.01 inches and/or to at least about 0.1 inches. Thermally conductive fibers may have a fiber diameter of at least about 3 microns, of at least about 30 microns and/or at least about 300 microns. Conductive fibers having a fiber diameter of at least about 10 microns are presently preferred.

Applications of the contemplated layered interface materials, thermal interface components and compliant fibrous interface components described herein comprise incorporating the materials into a layered material, a layered component, an electronic component, a semiconductor component, a finished electronic product or a finished semiconductor product.

Various objects, features, aspects and advantages of the present invention will become more apparent from the following detailed description of preferred embodiments of the invention.

BRIEF DESCRIPTION OF THE FIGURES

FIGS. 5A-C show a method of producing a preferred embodiment of the compliant fibrous interface component of the present invention.

FIG. 6 shows a preferred embodiment of the compliant fibrous interface component of the present invention.

DETAILED DESCRIPTION

Figure 1:
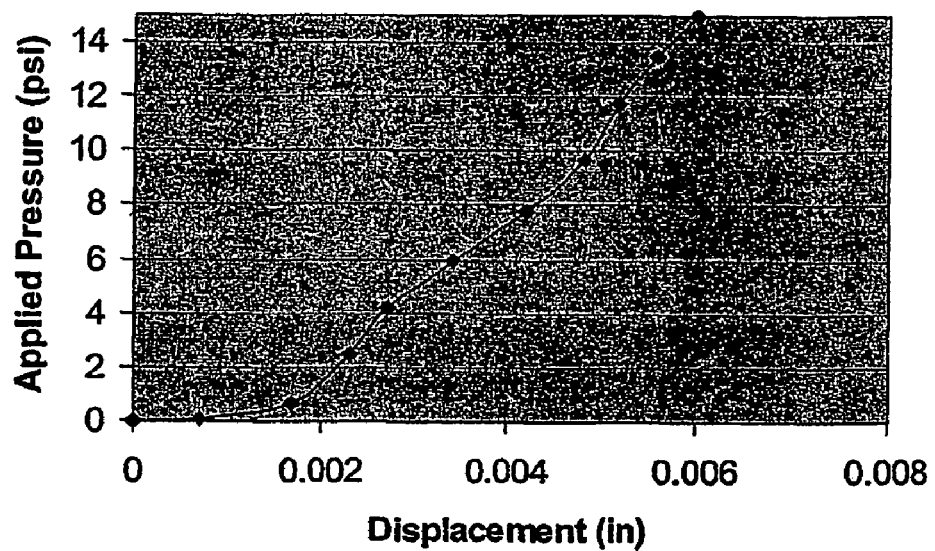
FIG. 1 shows a graph of displacement v. pressure for an embodiment of a compliant fibrous interface component.
Figure 2:
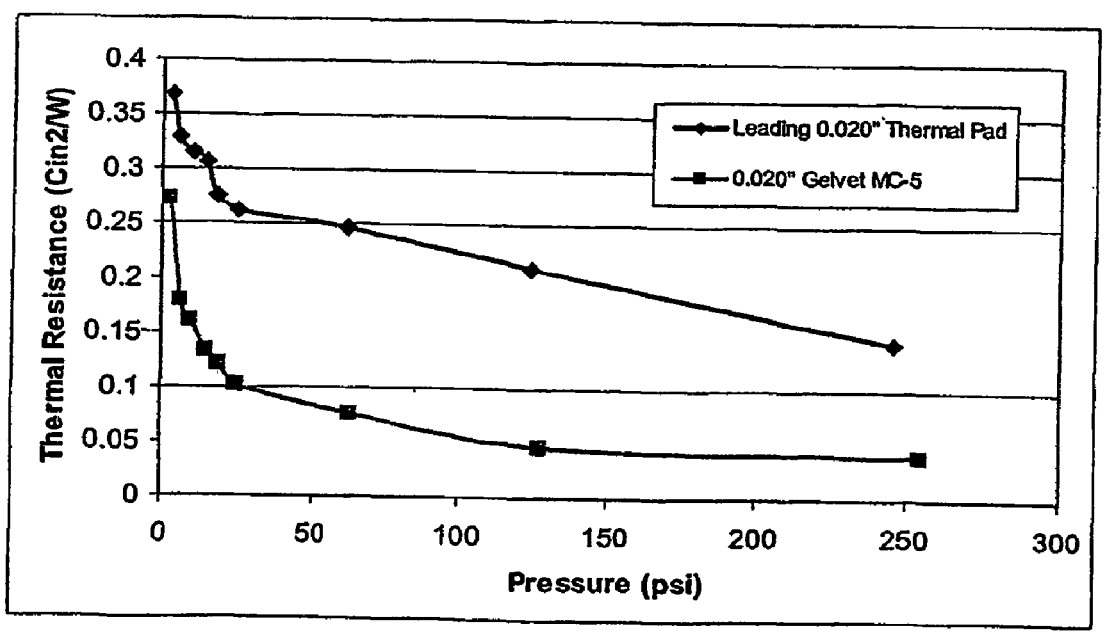
FIG. 2 shows a graph of thermal resistance v. pressure for an embodiment of a compliant fibrous interface component.
Figure 3:
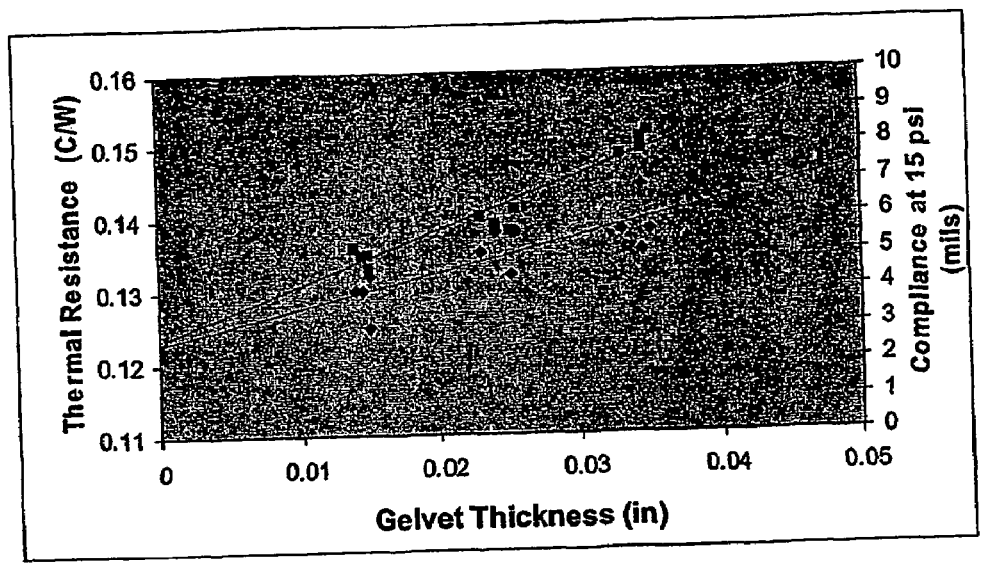
FIG. 3 shows a graph of thickness v. thermal resistance for an embodiment of a compliant fibrous interface component.

A suitable interface material or component should conform to the mating surfaces ("wets" the surface), possess a low bulk thermal resistance and possess a low contact resistance. Bulk thermal resistance can be expressed as a function of the material's or component's thickness, thermal conductivity and area. Contact resistance is a measure of how well a material or component is able to make contact with a mating surface, layer or substrate. The thermal resistance of an interface material or component can be shown as follows:

$$\Theta \text{interface} = t/kA + 2\Theta_{contact} \quad \text{Equation 1}$$

where $\Theta$ is the thermal resistance,
t is the material thickness,
k is the thermal conductivity of the material
A is the area of the interface The term "t/kA" represents the thermal resistance of the bulk material and "$2\Theta_{contact}$" represents the thermal contact resistance at the two surfaces. A suitable interface material or component should have a low bulk resistance and a low contact resistance, i.e. at the mating surface.

Many electronic and semiconductor applications require that the interface material or component accommodate deviations from surface flatness resulting from manufacturing and/or warpage of components because of coefficient of thermal expansion (CTE) mismatches.

A material with a low value for k, such as thermal grease, performs well if the interface is thin, i.e. the "t" value is low. If the interface thickness increases by as little as 0.002 inches, the thermal performance can drop dramatically. Also, for such applications, differences in CTE between the mating components causes the gap to expand and contract with each temperature or power cycle. This variation of the interface thickness can cause pumping of fluid interface materials (such as grease) away from the interface.

Interfaces with a larger area are more prone to deviations from surface planarity as manufactured. To optimize thermal performance, the interface material should be able to conform to non-planar surfaces and thereby lower contact resistance.

Optimal interface materials and/or components possess a high thermal conductivity and a high mechanical compliance, e.g. will yield elastically when force is applied. High thermal conductivity reduces the first term of Equation 1 while high mechanical compliance reduces the second term. The layered interface materials and the individual components of the layered interface materials described herein accomplish these goals. When properly oriented, the thermally conductive fibers of the compliant fibrous interface component described herein will span the distance between the mating surfaces thereby allowing a continuous high conductivity path from one surface to the other surface. If the fibers are flexible and able to move in its tip region, better contact can be made with the surface. This contact will result in an excellent degree of surface contact and will minimize the contact resistance of the interface material.

Layered interface materials described herein comprise at least one crosslinkable thermal interface component and at least one compliant fibrous interface component coupled to the thermal interface component. A method of forming contemplated layered interface materials comprises: a) providing a crosslinkable thermal interface component; b) providing a compliant fibrous interface component; and c) physically coupling the thermal interface component and the compliant fibrous interface component. At least one additional layer may be coupled with the layered interface material described herein. The at least one additional layer can comprise another interface material, a surface, a substrate, an adhesive or any other suitable layer.

Crosslinkable Thermal Interface Component

A contemplated crosslinkable thermal interface component is produced by combining at least one rubber compound, at least one amine resin and at least one thermally conductive filler. This contemplated interface material takes on the form of a liquid or "soft gel". As used herein, "soft gel" means a colloid in which the disperse phase has combined with the continuous phase to form a viscous "jelly-like" product. The gel state or soft gel state of the thermal interface component is brought about through a crosslinking reaction between the at least one rubber compound composition and the at least one amine resin composition. More specifically, the amine resin is incorporated into the rubber composition to crosslink the primary hydroxyl groups on the rubber compounds, thus forming the soft gel phase. Therefore, it is contemplated that at least some of the rubber compounds will comprise at least one terminal hydroxyl group. As used herein, the phrase "hydroxyl group" means the univalent group —OH occurring in many inorganic and organic compounds that ionize in solution to yield OH radicals. Also, the "hydroxyl group" is the characteristic group of alcohols. As used herein, the phrase "primary hydroxyl groups" means that the hydroxyl groups are in the terminal position on the molecule or compound. Rubber compounds contemplated herein may also comprise additional secondary, tertiary, or otherwise internal hydroxyl groups that could also undergo a crosslinking reaction with the amine resin. This additional crosslinking may be desirable depending on the final gel state needed for the product or component in which the gel is to be incorporated.

It is contemplated that the rubber compounds could be "self-crosslinkable" in that they could crosslink intermolecularly with other rubber compounds or intramolecularly with themselves, depending on the other components of the composition. It is also contemplated that the rubber compounds could be crosslinked by the amine resin compounds and perform some self-crosslinking activity with themselves or other rubber compounds.

In preferred embodiments, the rubber compositions or compounds utilized can be either saturated or unsaturated. Saturated rubber compounds are preferred in this application because they are less sensitive to thermal oxidation degradation. Examples of saturated rubbers that may be used are ethylene-propylene rubbers (EPR, EPDM), polyethylene/butylene, polyethylene-butylene-styrene, polyethylene-propylene-styrene, hydrogenated polyalkyldiene "mono-ols" (such as hydrogenated polybutadiene mono-ol, hydrogenated polypropadiene mono-ol, hydrogenated polypentadiene mono-ol), hydrogenated polyalkyldiene "diols" (such as hydrogenated polybutadiene diol, hydrogenated polypropadiene diol, hydrogenated polypentadiene diol) and hydrogenated polyisoprene. However, if the compound is unsaturated, it is most preferred that the compound undergo a hydrogenation process to rupture or remove at least some of the double bonds. As used herein, the phrase "hydrogenation process" means that an unsaturated organic compound is reacted with hydrogen by either a direct addition of hydrogen to some or all of the double bonds, resulting in a saturated product (addition hydrogenation), or by rupturing the double bond entirely, whereby the fragments further react with hydrogen (hydrogenolysis). Examples of unsaturated rubbers and rubber compounds are polybutadiene, polyisoprene, polystyrene-butadiene and other unsaturated rubbers, rubber compounds or mixtures/combinations of rubber compounds.

As used herein, the term "compliant" encompasses the property of a material or a component that is yielding and formable, especially at about room temperature, as opposed to solid and unyielding at room temperature. As used herein, the term "crosslinkable" refers to those materials or compounds that are not yet crosslinked.

As used herein, the term "crosslinking" refers to a process in which at least two molecules, or two portions of a long molecule, are joined together by a chemical interaction. Such interactions may occur in many different ways including formation of a covalent bond, formation of hydrogen bonds, hydrophobic, hydrophilic, ionic or electrostatic interaction. Furthermore, molecular interaction may also be characterized by an at least temporary physical connection between a molecule and itself or between two or more molecules.

More than one rubber compound of each type may be combined to produce a crosslinkable thermal interface component; however, it is contemplated that in the preferred thermal interface component, at least one of the rubber compounds or constituents will be a saturated compound. Olefin-containing or unsaturated thermal interface components, with appropriate thermal fillers, exhibit a thermal capability of less than $0.5\ cm^{2\circ}\ C./w$. Unlike thermal grease, thermal performance of the thermal interface component will not degrade after thermal cycling or flow cycling in IC devices because liquid olefins and liquid olefin mixtures (such as those comprising amine resins) will crosslink to form a soft gel upon heat activation. Moreover, when applied as a thermal interface component, it will not be "squeezed out" as thermal grease does in use and will not display interfacial delamination during thermal cycling.

Amine or amine-based resins are added or incorporated into the rubber composition or mixture of rubber compounds primarily to facilitate a crosslinking reaction between the amine resin and the primary or terminal hydroxyl groups on at least one of the rubber compounds. The crosslinking reaction between the amine resin and the rubber compounds produces a "soft gel" phase in the mixture, instead of a liquid state. The degree of crosslinking between the amine resin and the rubber composition and/or between the rubber compounds themselves will determine the consistency of the soft gel. For example, if the amine resin and the rubber compounds undergo a minimal amount of crosslinking (10% of the sites available for crosslinking are actually used in the crosslinking reaction) then the soft gel will be more "liquid-like". However, if the amine resin and the rubber compounds undergo a significant amount of crosslinking (40-60% of the sites available for crosslinking are actually used in the crosslinking reaction and possibly there is a measurable degree of intermolecular or intramolecular crosslinking between the rubber compounds themselves) then the gel would become thicker and more "solid-like".

Amine and amino resins are those resins that comprise at least one amine substituent group on any part of the resin backbone. Amine and amino resins are also synthetic resins derived from the reaction of urea, thiourea, melamine or allied compounds with aldehydes, particularly formaldehyde. Typical and contemplated amine resins are primary amine resins, secondary amine resins, tertiary amine resins, glycidyl amine epoxy resins, alkoxybenzyl amine resins, epoxy amine resins, melamine resins, alkylated melamine resins, and melamine-acrylic resins. Melamine resins are particularly useful and preferred in several contemplated embodiments described herein because a) they are ring-based compounds, whereby the ring contains three carbon and three nitrogen atoms, b) they can combine easily with other compounds and molecules through condensation reactions, c) they can react with other molecules and compounds to facilitate chain growth and crosslinking, d) they are more water resistant and heat resistant than urea resins, e) they can be used as water-soluble syrups or as insoluble powders dispersible in water, and f) they have high melting points (greater than 325° C. and are relatively non-flammable). Alkylated melamine resins, such as butylated melamine resins, propylated melamine resins, pentylated melamine resins hexylated melamine resins and the like, are formed by incorporating alkyl alcohols during the resin formation. These resins are soluble in paint and enamel solvents and in surface coatings.

Thermal filler particles to be dispersed in the thermal interface component or mixture should advantageously have a high thermal conductivity. Suitable filler materials include metals, such as silver, copper, aluminum, and alloys thereof; and other compounds, such as boron nitride, aluminum nitride, silver coated copper, silver-coated aluminum, conductive polymers and carbon fibers. Combinations of boron nitride and silver or boron nitride and silver/copper also provide enhanced thermal conductivity. Boron nitride in amounts of at least 20 wt % and silver in amounts of at least about 60 wt % are particularly useful. Preferably, fillers with a thermal conductivity of greater than about 20 and most preferably at least about 40 w/m° C. can be used. Optimally, it is desired to have a filler of not less than about 80 w/m° C. thermal conductivity.

As used herein, the term "metal" means those elements that are in the d-block and f-block of the Periodic Chart of the Elements, along with those elements that have metal-like properties, such as silicon and germanium. As used herein, the phrase "d-block" means those elements that have electrons filling the 3d, 4d, 5d, and 6d orbitals surrounding the nucleus of the element. As used herein, the phrase "f-block" means those elements that have electrons filling the 4f and 5f orbitals surrounding the nucleus of the element, including the lanthanides and the actinides. Preferred metals include indium, silver, copper, aluminum, tin, bismuth, gallium and alloys thereof, silver coated copper, and silver coated aluminum. The term "metal" also includes alloys, metal/metal composites, metal ceramic composites, metal polymer composites, as well as other metal composites. As used herein, the term "compound" means a substance with constant composition that can be broken down into elements by chemical processes.

Of special efficacy is a filler comprising a particular form of carbon fiber referred to as "vapor grown carbon fiber" (VGCF), such as is available from Applied Sciences, Inc., Cedarville, Ohio. VGCF, or "carbon micro fibers", are highly graphized types by heat treatment (thermal conductivity=1900 w/m° C.). Addition of about 0.5 wt. % carbon micro fibers provides significantly increased thermal conductivity. Such fibers are available in varying lengths and diameters; namely, 1 millimeter (mm) to tens of centimeters (cm) length and from under 0.1 to over 100 μm in diameter. One useful form of VGCF has a diameter of not greater than about 1 m and a length of about 50 to 100 μm, and possess a thermal conductivity of about two or three times greater than with other common carbon fibers having diameters greater than 5 μm.

It is difficult to incorporate large amounts of VGCF in polymer systems and interface components and systems, such as the hydrogenated rubber and resin combination already discussed. When carbon microfibers, e.g. (about 1 μm, or less) are added to the polymer they do not mix well, primarily because a large amount of fiber must be added to the polymer to obtain any significant beneficial improvement in thermal conductivity. However, we have discovered that relatively large amounts of carbon microfibers can be added to polymer systems that have relatively large amounts of other conventional fillers. A greater amount of carbon microfibers can be added to the polymer when added with other fibers, which can be added alone to the polymer, thus providing a greater benefit with respect to improving thermal conductivity of the thermal interface component. Desirably, the ratio of carbon microfibers to polymer is in the range of 0.05 to 0.50 by weight.

Once the thermal interface component that comprises at least one rubber compound, at least one amine resin, and at least one thermally conductive filler has been prepared, the composition must be compared to the needs of the electronic component, vendor, or electronic product to determine if an additional phase change material is needed to change some of the physical properties of the composition. Specifically, if the needs of the component or product require that the composition or interface material be in a "soft gel" form or a somewhat liquid form, then an additional phase change material may not need to be added. However, if the component, layered material or product requires that the composition or material be more like a solid, then at least one phase change material should be added.

Phase-change materials that are contemplated herein comprise waxes, polymer waxes or mixtures thereof, such as paraffin wax. Paraffin waxes are a mixture of solid hydrocarbons having the general formula $C_nH_{2n+2}$ and having melting points in the range of about 20° C. to 100° C. Examples of some contemplated melting points are about 45° C. and 60° C. Thermal interface components that have melting points in this range are PCM45 and PCM60HD—both manufactured by Honeywell Electronic Materials. Polymer waxes are typically polyethylene waxes, polypropylene waxes, and have a range of melting points from about 40° C. to 160° C.

PCM45 comprises a thermal conductivity of about 3.0 W/mK, a thermal resistance of about 0.25° C. cm$^2$/W (0.0038° C. cm$^2$/W), is typically applied at a thickness of about 0.0015 inches (0.04 mm) and comprises a typical softness of about 5 to 30 psi (plastically flow under). Typical characteristics of PCM45 are a) a super high packaging density—over 80%, b) a conductive filler, c) extremely low thermal resistance, and as mentioned earlier d) about a 45° phase change temperature. PCM60HD comprises a thermal conductivity of about 5.0 W/mK, a thermal resistance of about 0.17° C. cm$^{21}$W (0.0028° C. cm$^2$/W), is typically applied at a thickness of about 0.0015 inches (0.04 mm) and comprises a typical softness of about 5 to 30 psi (plastically flow under). Typical characteristics of PCM45 are a) a super high packaging density—over 80%, b) a conductive filler, c) extremely low thermal resistance, and as mentioned earlier d) about a 60° phase change temperature. TM350 (a thermal interface component not comprising a phase change material and manufactured by Honeywell Electronic Materials) comprises a thermal conductivity of about 3.0 W/mK, a thermal resistance of about 0.25° C. cm$^2$/W (0.0038° C. cm$^2$/W), is typically applied at a thickness of about 0.0015 inches (0.04 mm) and comprises a typical softness of about 5 to 30 psi plastically flow under). Typical characteristics of TM350 are a) a super high packaging density—over 80%, b) a conductive filler, c) extremely low thermal resistance, d) about a 125° curing temperature, and e) dispensable non-silicone-based thermal gel.

Phase change materials are useful in thermal interface component applications because they store and release heat as they oscillate between solid and liquid form. As a phase change material changes to a solid state, it gives off heat. As it returns to a liquid, it absorbs heat. The phase change temperature is the melting temperature at which the heat absorption and rejection takes place.

Paraffin-based phase change materials, however, have several drawbacks. On their own, they can be very fragile and difficult to handle. They also tend to squeeze out of a gap from the device in which they are applied during thermal cycling, very much like grease. The rubber-resin modified paraffin polymer wax system described herein avoids these problems and provides significantly improved ease of handling, is capable of being produced in flexible tape or solid layer form, and does not pump out or exude under pressure. Although the rubber-resin-wax mixtures may have the same or nearly the same temperature, their melt viscosity is much higher and they do not migrate easily. Moreover, the rubber-wax-resin mixture can be designed to be self-crosslinking, which ensures elimination of the pump-out problem in certain applications. Examples of contemplated phase change materials are malenized paraffin wax, polyethylene-maleic anhydride wax, and polypropylene-maleic anhydride wax. The rubber-resin-wax mixtures will functionally form at a temperature between about 50 to 150° C. to form a crosslinked rubber-resin network.

It is also advantageous to incorporate additional fillers, substances or particles, such as filler particles, wetting agents or antioxidants into the thermal interface component. Substantially spherical filler particles can be added to the thermal interface component to maximize packing density. Additionally, substantially spherical shapes or the like will provide some control of the thickness during compaction. Typical particle sizes useful for fillers in the rubber material may be in the range of about 1-20 μm with a maximum of about 100 μm.

Dispersion of filler particles can be facilitated by addition of functional organometallic coupling agents or "wetting" agents, such as organosilane, organotitanate, organozirconium, etc. Organotitanate acts a wetting enhancer to reduce paste viscosity and to increase filler loading. An organotitanate that can be used is isopropyl triisostearyl titanate. The general structure of organotitanate is RO—Ti(OXRY) where RO is a hydrolyzable group, and X and Y are binder functional groups.

Antioxidants may also be added to inhibit oxidation and thermal degradation of the cured rubber gel or solid thermal-interface component. Typical useful antioxidants include Irganox 1076, a phenol type or Irganox 565, an amine type, (at 0.01% to about 1 wt. %), available from Ciba Giegy of Hawthorne, N.Y. Typical cure accelerators include tertiary amines such as didecylanethylamine, (at 50 ppm—0.5 wt. %).

At least one catalyst may also be added to the thermal interface component in order to promote a crosslinking or chain reaction between the at least one rubber compound, the at least one amine resin, the at least one phase change material, or all three. As used herein, the term "catalyst" means that substance or condition that notably affects the rate of a chemical reaction without itself being consumed or undergoing a chemical change. Catalysts may be inorganic, organic, or a combination of organic groups and metal halides. Although they are not substances, light and heat can also act as catalysts. In contemplated embodiments, the catalyst is an acid. In preferred embodiments, the catalyst is an organic acid, such as carboxylic, acetic, formic, benzoic, salicylic, dicarboxylic, oxalic, phthalic, sebacic, adipic, oleic, palmitic, stearic, phenylstearic, amino acids and sulfonic acid.

A method for forming the crosslinkable thermal interface components disclosed herein comprises a) providing at least one saturated rubber compound, b) providing at least one amine resin, c) crosslinking the at least one saturated rubber compound and the at least one amine resin to form a crosslinked rubber-resin mixture, d) adding at least one thermally conductive filler to the crosslinked rubber-resin mixture, and e) adding a wetting agent to the crosslinked rubber-resin mixture. This method can also further comprise adding at least one phase change material to the crosslinked rubber-resin mixture. As discussed herein, liquid and solid thermal interface components can be formed using the contemplated method, along with tapes, electronic components, semiconductor components, layered materials and electronic and semiconductor products.

The contemplated thermal interface component can be provided as a dispensable liquid paste to be applied by dispensing methods (such as screen printing) and then cured as desired. It clan also be provided as a highly compliant, cured, elastomer film or sheet for pre-application on interface surfaces, such as heat sinks. It can further be provided and produced as a soft gel or liquid that can be applied to surfaces by any suitable dispensing method. Even further, the thermal interface component can be provided as a tape that can be applied directly to interface surfaces or electronic components.

To illustrate several embodiments of the thermal interface components, a number of examples were prepared by mixing the components described in Examples A through F. As indicated in the tables, the properties of the compositions including viscosity, product form, thermal impedance, modulus of elasticity, and thermal conductivity are also reported.

The examples shown include one or more of the optional additions, e.g., antioxidant, wetability enhancer, curing accelerators, viscosity reducing agents and crosslinking aids. The amounts of such additions may vary but, generally, they may be usefully present in the following approximate amounts (in wt. %): filler up to 95% of total (filler plus rubbers); wetability enhancer 0.1 to 1% (of total); antioxidant 0.01 to 1% (of total); curing accelerator 50 ppm—0.5% (of total); viscosity reducing agents 0.2-15%; and crosslinking aids 0.1-2%. It should be noted the addition at least about 0.5% carbon fiber significantly increases thermal conductivity.

|  | Composition (by wt %) | | | | | |
| --- | --- | --- | --- | --- | --- | --- |
|  | A | B | C | D | E | F |
| Hydrogenated polybutylene mono-ol | 7.5 | 6.3 | 10 | 11.33 | 5 | 18 |
| Hydrogenated polybutadiene diol | none | none | 2 | none | none | none |
| Paraffin Wax | 3.1 | 2.2 | none | none | none | none |
| Alkylated melamine resin (butylated) | 1.7 | 0.4 | 1.33 | 2 | 1 | 4 |
| Organotitanate | 1.5 | 1.0 | 6.67 | 6.67 | 4 | 8 |
| Sulfonic Acid Catalyst | 0.1 | none | none | none | none | none |
| Phenolic Antioxidant | 0.1 | 0.1 | none | none | none | none |
| Aluminum powder | 86 | 90 | 80 | 80 | none | none |
| Silver Powder | none | none | none | none | 90 | none |
| Boron Nitride | none | none | none | none | none | 70 |
| Product Form | Tape | Tape | Liquid | Liquid | Liquid | Liquid |
| Thermal Impedance (oC. cm2/w) | 0.25 | 0.18 | 0.25 | 0.25 | 0.3 | 0.35 |
| Thermal conductivity (w · m/oC.) | 3.0 | 5.0 | 2.8 | 2.8 | 2.3 | 2.0 |
| Modulus of Elasticity, Pa | 300000 | 270000 | 500000 | 300000 | 280000 | 270000 |
| Viscosity, Pa · s | N/A | N/A | 200 | 160 | 150 | 220 |

Compliant Fibrous Interface Component

Figure 4:
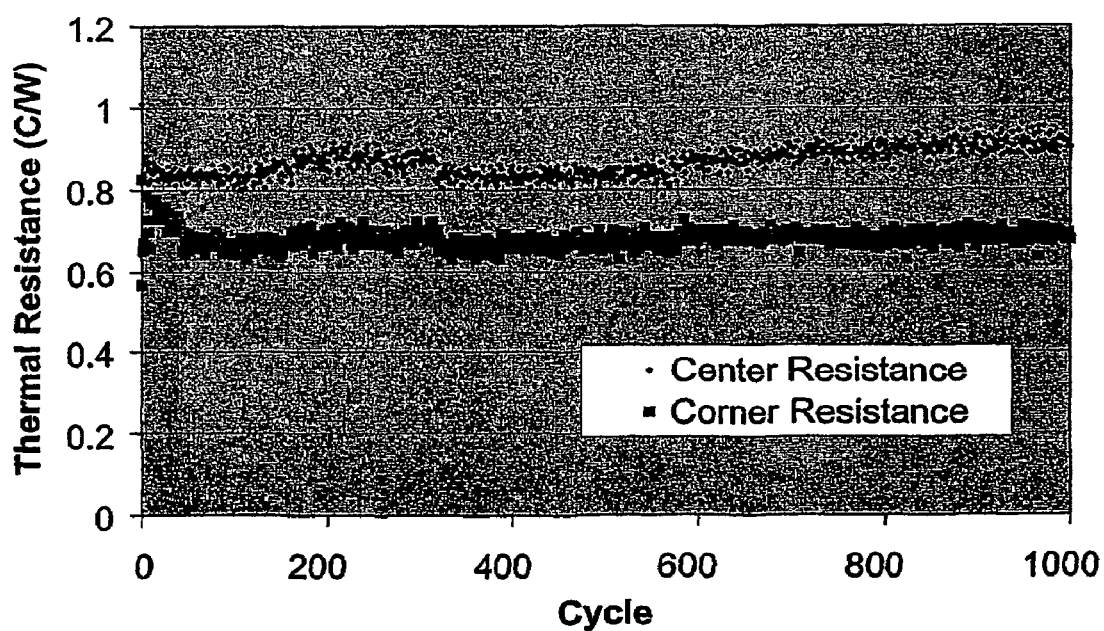
FIG. 4 shows a graph of cycle v. thermal resistance for an embodiment of a compliant fibrous interface component.

Compliant fibrous interface components, such as those described herein, comprise a plurality of thermally conductive fibers, an encapsulant, and an optional adhesive material. Examples of compliant fibrous interface components can be found in U.S. patent application Ser. Nos. 09/193,415; 09/103,416 and 09/333,564—all of which are incorporated herein by reference in their entirety. Also, compliant fibrous interface components, such as those described herein, are those manufactured by Honeywell Electronic Materials under the tradename of GELVET. GELVET comprises a thermal conductivity of about 30.0 W/mK, a thermal resistance of about 0.68° C. cm²/W (0.0010° C. cm²/W), is typically applied at a thickness of about 0.012 to 0.100 inches (0.3-2.5 mm) and comprises a typical softness of about greater than 25% of deflection under 10 psi. Typical characteristics of GELVET are a) thickness variable over a wide range, b) compliance to geometric and thermal mismatch, c) very high thermal conductivity, and d) reliable over long-term use of the component. FIGS. 1-4 show several performance measurements of the GELVET component, including displacement v. pressure (FIG. 1), thermal resistance v. pressure (FIG. 2), thickness v. thermal resistance (FIG. 3), and cycle v. thermal resistance (FIG. 4).

Suitable thermally conductive fibers comprise diamond fibers, conductive polymer fibers, carbon fibers, graphite fibers and metal fibers, such as copper fibers and aluminum fibers. The thermally conductive fibers are cut to a particular length, e.g. from at least about 0.0005 inches to at least about 1 inch. Thermally conductive fibers contemplated herein may also be cut to at least about 0.001 inches, to at least about 0.01 inches and/or to at least about 0.1 inches. Thermally conductive fibers contemplated herein may have a fiber diameter of at least about 3 microns, of at least about 30 microns and/or at least about 300 microns. Conductive fibers having a fiber diameter of at least about 10 microns are presently preferred. Suitable thermally conductive fibers have a thermal conductivity of at least about 25 W/mK. Some suitable fibers are those available from Amoco identified as K-1100, K-800, P-120, P-100, P-70 and T50; as well as fibers available from Toray designated as M46J and M46JB.

Thermally conductive fibers disclosed herein can be cleaned, if necessary, to remove any coatings present on the fibers. Some commercially available fibers are sold with a coating applied to the surface, which is preferably removed by cleaning the fibers. One method of cleaning thermally conductive fibers is by heating the fibers in air to burn off the coating, i.e. sizing. However, chemical cleaning methods can also be used.

A method of forming the compliant fibrous interface component comprises: a) providing thermally conductive fibers having a length; b) providing a substrate; c) applying adhesive to the substrate; d) flocking the fibers to the substrate; e) embedding the fibers into the adhesive with a portion of the fibers extending out of the adhesive; f) curing the adhesive; disposing a curable encapsulant between the fibers extending out of the adhesive and beneath the free ends of the fibers; g) compressing the fibers with encapsulant between the fibers into the adhesive; and h) curing the encapsulant while under compression.

To produce a compliant fibrous interface component, a first adhesive is applied to a substrate. The adhesive may comprise any suitable material, but will likely comprise a low stress adhesive, for example, an adhesive comprising an epoxy compound (e.g. Eccobond 281 from Grace Specialty Polymers), although cyanate ester adhesive, BMI, silicones, organosilicones, gels and spray gasket materials are also useful.

The fibers are flocked to the substrate, thereby embedding the fibers in the adhesive, as shown in FIG. 5A, for example, by electroflocking. Electroflocking is a well-known procedure whereby two plates, separated by some distance, are charged to opposite polarity. The procedure is described generically by Bolgen (Bolgen, Stig W., "Flocking Technology", Journal of Coated Fabrics, Volume 21, page 123, 1991); and specifically for electroflocking of carbon fibers by Shigematsu in "Application of Electrostatic Flocking to Thermal Control Coating", Proceedings of the 14th International Symposium on Space Technology and Science, 1984, page 583; and by Kato in "Formation of a Very Low-Reflectance Surface by Electrostatic Flocking", Proceedings of the 4th European Symposium on Space Environmental and Control Systems, 1991, page 565. The disclosures of these articles are expressly incorporated herein by reference in their entirety.

In the electroflocking process, fibers on one plate pick up that plate's charge and become attracted to the opposite plate. They embed in the adhesive when they hit the opposite plate. If they do not stick initially, fibers bounce back and forth between plates until they become embedded in the adhesive, escape the electric field or the charge on the plates is removed. The fiber structure that results is aligned with respect to the electric field lines, i.e. has a substantially vertical orientation and has a velvet-like appearance.

Mechanical flocking involves passing an adhesive-coated object over a series of rapidly rotating rollers or beater bars, which cause the substrate to vibrate. Fibers are fed onto the substrate by gravity from a hopper. The vibrations produced by the rollers or beater bars orient the fibers and drive them into the adhesive. Excess fiber is removed, leaving a fiber structure with substantially vertical orientation.

Pneumatic flocking uses an airstream to deliver fibers to an adhesive coated surface. While in flight, fibers align themselves in the direction of the airflow and embed in the adhesive in an oriented manner.

Different flocking methods may be used alone, or in combination with one another, e.g. pneumatic/electrostatic flocking. With this combination method, an airstream containing fibers is directed through a nozzle. At the exit of the nozzle, a charge orients the fibers with respect to the electric field lines. The fiber structure that results is also aligned, i.e. has substantial vertical orientation, but may be denser, more uniform or produced more rapidly than when either method is used alone.

The flocked fibers are seated into the adhesive with a portion of their lengths extending from the adhesive layer referred to as "free fiber tips". After flocking, a downward force (compression) is applied to the free fiber tips to seat the fibers in the adhesive and to minimize the distance between the fiber tips embedded in the adhesive and the surface substrate to which the adhesive is applied, as shown in FIGS. 5B and 5C.

The adhesive is then cured by any suitable method, including self-curing, heat curing and/or infrared curing. Oftentimes, heating for about 30 minutes at about 150° C. may be used for curing, depending on the adhesive and curing conditions.

As shown in FIG. 6, an encapsulant, 30, for example a gel such as GE RTV6166 dielectric gel available from General Electric Corporation is introduced to fill space between fibers 32 leaving free fiber tips 34 extending from the gel. This process can be done by stenciling uncured gel onto the fibers or applying the gel to the givers and letting the gel soak or wick in to the fibers. In contemplated embodiments, the gels will spontaneously wet the fibers and will wick in to the fiber structure. The gel may or may not include a thermally conductive filler material. A release liner, e.g. waxy or silicone-coated paper, may be placed on top of the fibers and uncured gel to prevent the cured gel/fiber material from sticking to a clamping fixture, and to provide protection to the interface material during shipping or subsequent handling.

The interface material with uncured gel between the fibers is compressed to less than the nominal cut fiber length and clamped in place to this compressed height. For example, if the fiber is about 0.020 inches long, adhesive cured gel is introduced then clamped to a height of about 0.017 inches before curing the gel, which holds the fiber at this height while the gel is cured.

The gel is then cured, e.g. thermally cured, while under compression. Heating generally accelerates curing and is desirable to create a contemplated free fiber tip structure. Both the compression and thermal cure aid in creating the free fiber tip structure. The thermal cure is beneficial since the CTE of the gel is higher than that of the fibers and the gel will shrink more than the fibers upon cooling to room temperature, thereby exposing more fiber tips.

In producing the interface material, the adhesive curing may be delayed to coincide with the curing of the gel. In one embodiment, the fibers are seated at the same time as the gel and the adhesive are cured. As indicated, compression is beneficial, and curing under compression is beneficial, because the gel will maintain the cured thickness and the fibers can spring back somewhat to stick up from the gel. Cohesion of the gel to the fibers is not strong enough to keep the fibers from assuming their original position prior to curing. Curing results in the free fiber tips which are desirable for enhanced thermal contact with the adjacent surface(s).

A method of forming contemplated layered interface materials comprises: a) providing a crosslinkable thermal interface component; b) providing a compliant fibrous interface component; and c) physically coupling the thermal interface component and the compliant fibrous interface component.

The crosslinkable thermal interface components and the compliant fibrous interface components can be individually prepared and provided by using the methods previously described herein. The two components are then physically coupled to produce a layered interface material. As used herein, the term "interface" means a couple or bond that forms the common boundary between two parts of matter or space. An interface may comprise a physical attachment or physical couple of two parts of matter or components or a physical attraction between two parts of matter or components, including bond forces such as covalent and ionic bonding, and non-bond forces such as Van der Waals, electrostatic, coulombic, hydrogen bonding and/or magnetic attraction. The two components, as described herein, may also be physically coupled by the act of applying one component to the surface of the other component.

Figure 7A:
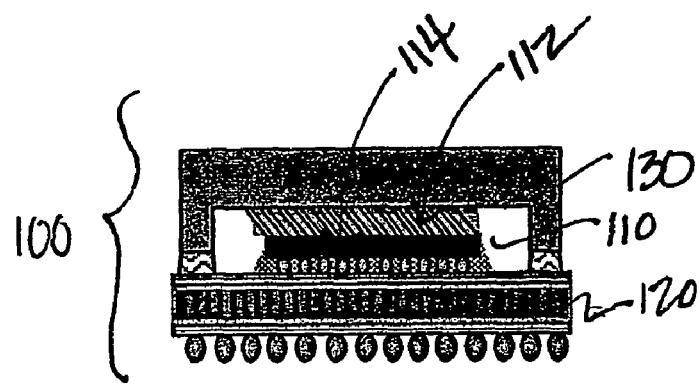
FIGS. 7A-B show several preferred embodiments of the layered interface material of the present invention.
Figure 7B:
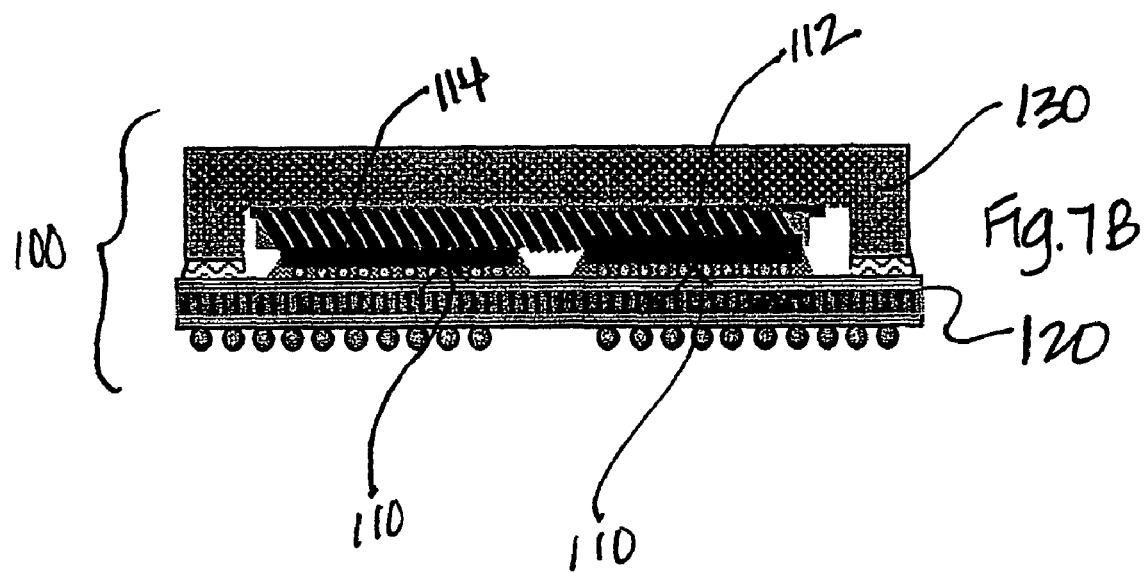

The layered interface material may then be applied to a substrate, another surface, or another layered material, as shown in FIGS. 7A and 7B. The electronic component 100 comprises a layered interface material 110, a substrate layer 120 and an additional layer 130. The layered interface material 110 comprises a compliant fibrous interface component 112 and a thermal interface component 114. Substrates contemplated herein may comprise any desirable substantially solid material. Particularly desirable substrate layers would comprise films, glass, ceramic, plastic, metal or coated metal, or composite material. In preferred embodiments, the substrate comprises a silicon or germanium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and it's oxides), a polymer-based packaging or board interface such as found in a polyimide-based flex package, lead or other metal alloy solder ball surface, glass and polymers such as polyimide. The "substrate" may even be defined as another polymer material when considering cohesive interfaces. In more preferred embodiments, the substrate comprises a material common in the packaging and circuit board industries such as silicon, copper, glass, and another polymer.

Additional layers of material may be coupled to the layered interface materials in order to continue building a layered component or printed circuit board. It is contemplated that the additional layers will comprise materials similar to those already described herein, including metals, metal alloys, composite materials, polymers, monomers, organic compounds, inorganic compounds, organometallic compounds, resins, adhesives and optical wave-guide materials.

A layer of laminating material or cladding material can be coupled to the layered interface materials depending on the specifications required by the component. Laminates are generally considered fiber-reinforced resin dielectric materials. Cladding materials are a subset of laminates that are produced when metals and other materials, such as copper, are incorporated into the laminates. (Harper, Charles A., *Electronic Packaging and Interconnection Handbook*, Second Edition, McGraw-Hill (New York), 1997.)

Spin-on layers and materials may also be added to the layered interface materials or subsequent layers. Spin-on stacked films are taught by Michael E. Thomas, "Spin-On Stacked Films for Low $k_{eff}$ Dielectrics", *Solid State Technology* (July 2001), incorporated herein in its entirety by reference.

Applications of the contemplated thermal interface components, layered interface materials and compliant fibrous interface components described herein comprise incorporating the materials and/or components into another layered material, an electronic component or a finished electronic product. Electronic components, as contemplated herein, are generally thought to comprise any layered component that can be utilized in an electronic-based product. Contemplated electronic components comprise circuit boards, chip packaging, separator sheets, dielectric components of circuit boards, printed-wiring boards, and other components of circuit boards, such as capacitors, inductors, and resistors.

Electronic-based products can be "finished" in the sense that they are ready to be used in industry or by other consumers. Examples of finished consumer products are a television, a computer, a cell phone, a pager, a palm-type organizer, a portable radio, a car stereo, and a remote control. Also contemplated are "intermediate" products such as circuit boards, chip packaging, and keyboards that are potentially utilized in finished products.

Electronic products may also comprise a prototype component, at any stage of development from conceptual model to final scale-up/mock-up. A prototype may or may not contain all of the actual components intended in a finished product, and a prototype may have some components that are constructed out of composite material in order to negate their initial effects on other components while being initially tested.

Thus, specific embodiments and applications of interface materials have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A layered interface material, comprising:
   at least one crosslinkable thermal interface component; and
   at least one compliant fibrous interface component coupled to the thermal interface component.

2. The layered interface material of claim 1, wherein the at least one thermal interface component comprises at least one rubber compound, at least one amine resin and at least one thermally conductive filler.

3. The layered interface material of claim 2, wherein the at least one thermal interface component further comprises at least one phase change material.

4. The layered interface material of claim 2, wherein the at least one rubber compound comprises at least one terminal hydroxy group.

5. The layered interface material of claim 2, wherein the at least one rubber compound comprises at least one saturated compound.

6. The layered interface material of claim 4, wherein the at least one rubber compound further comprises at least one saturated compound.

7. The layered interface material of claim 4, wherein the at least one rubber compound comprises hydrogenated polyalkyldiene mono-ol, hydrogenated polyalkyldiene diol, or a combination or mixture thereof.

8. The layered interface material of claim 7, wherein the hydrogenated polyalkyldiene mono-ol comprises hydrogenated polybutadiene mono-ol.

9. The layered interface material of claim 7, wherein the hydrogenated polyalkyldiene diol comprises hydrogenated polybutadiene diol.

10. The layered interface material of claim 2, wherein the at least one amine resin comprises a melamine resin.

11. The layered interface material of claim 10, wherein the melamine resin comprises an alkylated melamine resin.

12. The layered interface material of claim 11, wherein the alkylated melamine resin comprises butylated melamine resin.

13. The layered interface material of claim 2, wherein the at least one thermally conductive filler comprises a metal powder, a boron nitride compound or a combination thereof.

14. The layered interface material of claim 13, wherein the metal powder comprises aluminum powder, silver powder, copper powder or a combination thereof.

15. The layered interface material of claim 3, wherein the at least one phase change material comprises a wax.

16. The layered interface material of claim 15, wherein the wax comprises a paraffin wax.

17. The layered interface material of claim 2, further comprising at least one catalytic material.

18. The layered interface material of claim 3, further comprising at least one catalytic material.

19. The layered interface material of claim 1, wherein the compliant fibrous interface component comprises a plurality of flocked thermally conductive fibers.

20. The layered interface material of claim 19, wherein the plurality of flocked thermally conductive fibers are embedded in an adhesive material.

21. The layered material of claim 20, wherein the plurality of flocked thermally conductive fibers are embedded in a substantially vertical orientation with portions of the plurality of fibers extending out of the adhesive material.

22. The layered material of claim 21, wherein the plurality of flocked thermally conductive fibers comprise an encapsulant material disposed between the portions of the plurality of fibers, wherein the plurality of fibers extends out of the encapsulant material.

23. The layered material of claim 19, wherein the plurality of flocked thermally conductive fibers comprises carbon, graphite, metal, ceramic, conductive polymer, diamond or a combination thereof.

24. The layered material of claim 23, wherein the plurality of flocked thermally conductive fibers comprises carbon.

25. The layered material of claim 19, wherein the plurality of flocked thermally conductive fibers comprises a length of at least about 0.0005 inches.

26. The layered material of claim 25, wherein the plurality of flocked thermally conductive fibers comprises a length of at least about 0.001 inches.

27. The layered material of claim 26, wherein the plurality of flocked thermally conductive fibers comprises a length of at least about 0.01 inches.

28. The layered material of claim 27, wherein the plurality of flocked thermally conductive fibers comprises a length of at least about 0.1 inches.

29. The layered material of claim 28, wherein the plurality of flocked thermally conductive fibers comprises a length of at least about 1 inch.

30. The layered material of claim 19, wherein the plurality of flocked thermally conductive fibers comprises a fiber diameter of at least about 3 microns.

31. The layered material of claim 30, wherein the plurality of flocked thermally conductive fibers comprises a fiber diameter of at least about 30 microns.

32. The layered material of claim 31, wherein the plurality of flocked thermally conductive fibers comprises a fiber diameter of at least about 300 microns.

33. The layered material of claim 19, wherein the encapsulant comprises a gel material.

34. The layered material of claim 33, wherein the gel material comprises a silicon gel, a spray gasket material or a combination thereof.

35. The layered material of claim 19, wherein the plurality of thermally conductive fibers comprises a thermal conductivity of at least about 25 W/mK.

36. A layered component comprising the layered interface material of claim 1.

37. An electronic component comprising the layered interface material of claim 1.

38. A layered component comprising the layered interface material of claim 2.

39. An electronic component comprising the layered interface material of claim 2.

40. A layered component comprising the layered interface material of claim 3.

41. An electronic component comprising the layered interface material of claim 3.

42. A tape comprising the layered interface material of claim 3.

43. A method of producing a layered interface material, comprising:
   providing a crosslinkable thermal interface component;

providing a compliant fibrous interface component; and physically coupling the thermal interface component and the compliant fibrous interface component.

44. A method of forming the crosslinkable thermal interface component of claim 43, comprising:

providing at least one saturated rubber compound;

providing at least one amine resin;

crosslinking the at least one saturated rubber compound and the at least one amine resin to form a crosslinked rubber-resin mixture;

adding at least one thermally conductive filler to the crosslinked rubber-resin mixture; and adding a wetting agent to the crosslinked rubber-resin mixture.

45. The method of claim 44, further comprising adding at least one phase change material to the crosslinked rubber-resin mixture.

46. A liquid thermal interface composition formed by the method of claim 45.

47. A solid thermal interface composition formed by the method of claim 45.

48. A tape comprising the thermal interface component of claim 45.

49. A method of forming the compliant fibrous interface component of claim 43, comprising:

providing thermally conductive fibers having a length;

providing a substrate;

applying adhesive to the substrate;

flocking the fibers to the substrate;

embedding the fibers into the adhesive with a portion of the fibers extending out of the adhesive;

curing the adhesive;

disposing a curable encapsulant between the fibers extending out of the adhesive and beneath the free ends of the fibers;

compressing the fibers with encapsulant between the fibers into the adhesive; and curing the encapsulant while under compression.

* * * * *

UNITED STATES PATENT AND TRADEMARK OFFICE
CERTIFICATE OF CORRECTION

PATENT NO. : 7,608,324 B2 Page 1 of 1
APPLICATION NO. : 10/465968
DATED : October 27, 2009
INVENTOR(S) : Nguyen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1386 days.

Signed and Sealed this

Twelfth Day of October, 2010

David J. Kappos
*Director of the United States Patent and Trademark Office*